United States Patent [19]

Deyer

[11] 4,404,515

[45] Sep. 13, 1983

[54] SYSTEM AND METHOD FOR USE WITH APPARATUS FOR SENSING BARE METAL ON A MOVING STRIP OF INSULATIVELY COATED CONDUCTIVE MATERIAL

[75] Inventor: Craig E. Deyer, Akron, Pa.

[73] Assignee: RCA Corporation, New York, N.Y.

[21] Appl. No.: 278,451

[22] Filed: Jun. 29, 1981

[51] Int. Cl.³ ...................... G01R 31/12; B65H 25/14
[52] U.S. Cl. .................................. 324/54; 200/61.18; 324/133
[58] Field of Search ............... 200/61.13, 61.18, 61.41, 200/61.42, 61.43; 324/133, 54, 65 R, 62 R

[56] References Cited

U.S. PATENT DOCUMENTS

| | | | |
|---|---|---|---|
| 3,709,192 | 1/1973 | Anderson | 324/65 R X |
| 3,935,458 | 1/1976 | Peters | 324/62 X |
| 4,126,510 | 11/1978 | Moscony et al. | 156/626 |
| 4,158,806 | 6/1979 | Kotylev | 324/65 R |
| 4,351,263 | 9/1982 | Rarig | 324/133 X |

OTHER PUBLICATIONS

Anderson: "Detecting Voids in Insulating Tape"-Electronics-Jan. 1954, p. 136.

Primary Examiner—Stanley T. Krawczewicz
Assistant Examiner—Jose M. Solis
Attorney, Agent, or Firm—E. M. Whitacre; D. H. Irlbeck; L. L. Hallacher

[57] ABSTRACT

A detector for detecting bare metal on a moving strip of insulatively coated conductive metal includes a plurality of sensors arranged along the edges of both sides of the strip. Each sensor includes a plurality of voltage biased contacts and a grounded contact. The inventive control system provides an actuate pulse when two voltage biased contacts on one sensor are electrically connected to the grounded contact of another sensor in accordance with the Boolean Function:

[(AB+BC+CA)·(DE+EF+FD)]+[(GH+HJ+J-G)·(KL+LM+MK)]+[(AB+BC-+CA)·(GH+HJ+JG)]+[(DE+EF+F-D)·(KL+LM+MK)]

where the letter designations alphabetically identify the voltage biased contacts of each sensor.

24 Claims, 26 Drawing Figures

Fig. 6a — BARE METAL PULSE 77 — 181 — BARE METAL PULSE OUTPUT OF INVERTER

Fig. 6b — OUTPUT OF INVERTER 83 — 182

Fig. 6c — Q̄ OUTPUT OF ONE SHOT 89 — 183 184

Fig. 6d — Q OUTPUT OF ONE SHOT 91 — 185 — 186

Fig. 6e — OUTPUT OF AND 84 — 187

Fig. 6f — Q OUTPUT OF FLIP FLOP 79 — 188 — TIME →

Fig. 7a — NOISE 189 — BARE METAL PULSE 77

Fig. 7b — 192 — OUTPUT OF INVERTER 83 Q̄ OUTPUT OF ONE SHOT 89

Fig. 7c —

Fig. 7d — Q OUTPUT OF ONE SHOT 91 — 190 — GENERATED BY NOISE — 193

Fig. 7e — OUTPUT OF AND 84 — 191

Fig. 7f — Q OUTPUT OF FLIP FLOP 79 — TIME →

SYSTEM AND METHOD FOR USE WITH APPARATUS FOR SENSING BARE METAL ON A MOVING STRIP OF INSULATIVELY COATED CONDUCTIVE MATERIAL

BACKGROUND OF THE INVENTION

This invention relates generally to the production of shadow masks for color television tubes and particularly to a system and method for use with an apparatus for detecting bare metal prior to the acid etching of such masks.

A colored television tube includes a shadow mask which serves as the color selection electrode. The shadow mask includes a large number of apertures through which the electron beams pass to impact a phosphor of the proper color. Typically, in the manufacture of shadow masks the aperture pattern is photographically reproduced on a photoresistive material which covers both sides of the conductive metal strip from which the masks are made. The unexposed photoresistive material is then washed away leaving bare metal at the aperture locations. The shadow mask material is then exposed to acid which etches through the bare metal to produce the apertures. Typically, the shadow mask material is in the form of a long strip which is pulled through the etch line by a roller. The metal strip is coated on both sides and a large number of aperture patterns sequentially produced on the strip. A large number of masks are thus etched as the strip of material is pulled through a tank of etching acid. Problems frequently arise when the acid inert photoresistive material is not uniformly applied across both sides of the entire metal strip. The bare metal exposed by the voids in the photoresistive material is etched. When the voids occur on both sides of the strip they are completely etched through and the strip frequently is severed in the acid tank and the etch line must be shut down. On occasions when the void occurs on only one side of the strip only partial etching occurs. However, this frequently results in a shutdown of the etch line because the partially etched metal is not strong enough to withstand the force required to pull the strip through the acid tank. In either event, the severing of the strip causes a shutdown of the etch line and requires entrance into the etch tank to retrieve and to repair the severed end.

The instant invention overcomes these problems by the provision of a system for controlling an apparatus which senses the bare metal exposed by the photoresist voids. The inventive system generates a signal which may be used to cause the application of an acid resistant material to the metal strip to protect the strip during etching.

CROSS REFERENCE TO RELATED APPLICATIONS

The instant invention can be used as the control circuit for the apparatus described in U.S. application Ser. No. 278,450, now U.S. Pat. No. 4,351,263 entitled "Apparatus And Method Of Sensing Bare Metal On A Moving Strip Of Insulatively Coated Conductive Material" filed by L. L. Rarig, R. A. Alleman, and D. L. Miller on even date herewith and assigned to RCA Corporation, the assignee of the instant application.

SUMMARY OF THE INVENTION

An apparatus for sensing bare metal on a moving strip of insulated conductive material includes a plurality of sensors arranged on both sides of the strip. Each of the sensors includes a plurality of voltage biased electrical contacts and a grounded electrical contact. A system for providing a bare metal output signal in response to the selective grounding of the voltage biased electrical contact includes a plurality of first means individually responsive to the sensors and provides a first output signal when at least one of the voltage bias contacts in one of the sensors is electrically connected to the grounded contact of another of the sensors. A plurality of second means are responsive to at least two of the first means and provide a second signal in response to the simultaneous reception of two of the first signals. Third means is responsive to the second means and provides a bare metal signal in response to the reception of the second signal.

DETAILED DESCRIPTION OF THE PREFERRED EMBODIMENT

Figure 1:
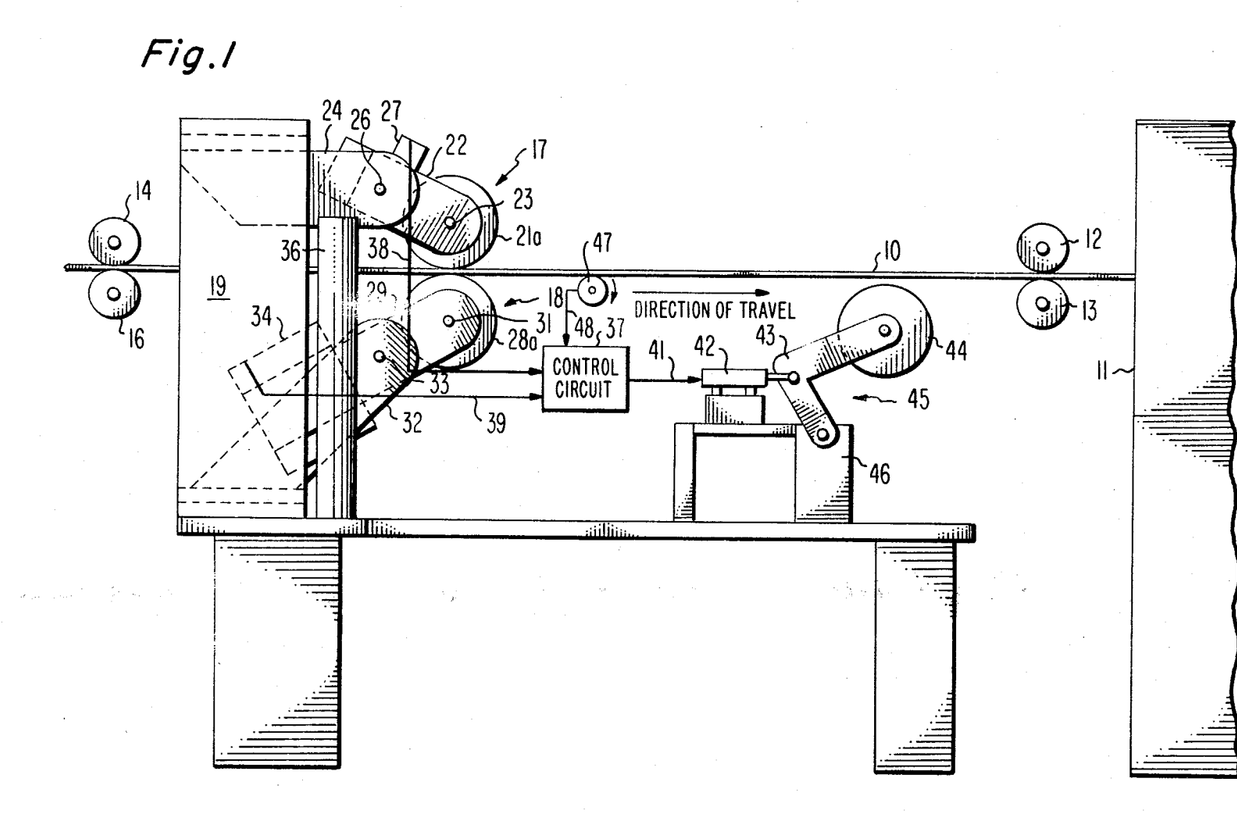
FIG. 1 shows a portion of a shadow mask etch line incorporating a bare metal sensor.

FIG. 1 shows an apparatus for sensing bare metal incorporated into an etch line of known type. A strip of conductive material 10 which was previously coated on both sides with a photoresistive material and photographically exposed and developed to produce a bare metal aperture pattern thereon is pulled into an acid etch tank 11. The exposed photoresistive material protects the conductive strip 10 so that this portion of the strip is unaffected while the bare metal areas at the aperture locations are etched completely through. The roller which pulls the conductive strip 10 through the etch tank 11 and other processing stages, such as rinsing and drying, are well known to those skilled in the art and are not shown or described herein. A plurality of rollers 12, 13, 14 and 16 are rotatably mounted in pairs to prevent vibration and to assure smooth travel of the strip 10. Bare metal exposed by voids in the photosensitive coating are sensed by two sensors 17 and 18 which respectively are mounted above and below the metal strip 10 on a mounting bracket 19.

The sensor 17 includes a disc-shaped electrical contact 21a which is rotatably mounted on an arm 22 to rotate about a rotation axis 23. The arm 22 is pivotably coupled to a mounting member 24 at a pivot axis 26. The axes 23 and 26 are substantially parallel to the upper surface of the metal strip 10.

The sensor 18 includes a disc-shaped electrical contact 28a rotatably mounted on an arm 29 on an axis 31. The arm 29 is pivotably coupled to a mounting member 32 at a pivot axis 33. The axes 31 and 33 are substantially parallel to the lower surface of the metal strip 10. The sensors 17 and 18 and the etch line are fully described in previously referenced U.S. Pat. No. 4,351,263.

The sensors 17 and 18 are electrically connected to a control circuit by leads 38 and 39, respectively. An output lead 41 of the control circuit 37 is connected to a taping mechanism 45. The output signal from the control circuit 37 on output lead 41 actuates a solenoid 42 resulting in the pivoting of an arm 43 so that a roll of tape 44 is caused to contact the bottom surface of the metal strip 10, thereby applying a strip of acid resistant tape to the bottom surface of the metal strip.

A pulser 47 is arranged to rotate in response to the motion of the strip 10. The pulser 47 provides a series of pulses to the control circuit 37 by a line 48. The number of pulses output by the pulser 47 is a function of the rotational velocity of the pulser. Accordingly, because the rotational velocity is a function of the speed of the strip 10, the frequency of the pulse input to the circuit 37 also is a function of the strip speed.

Figure 2:
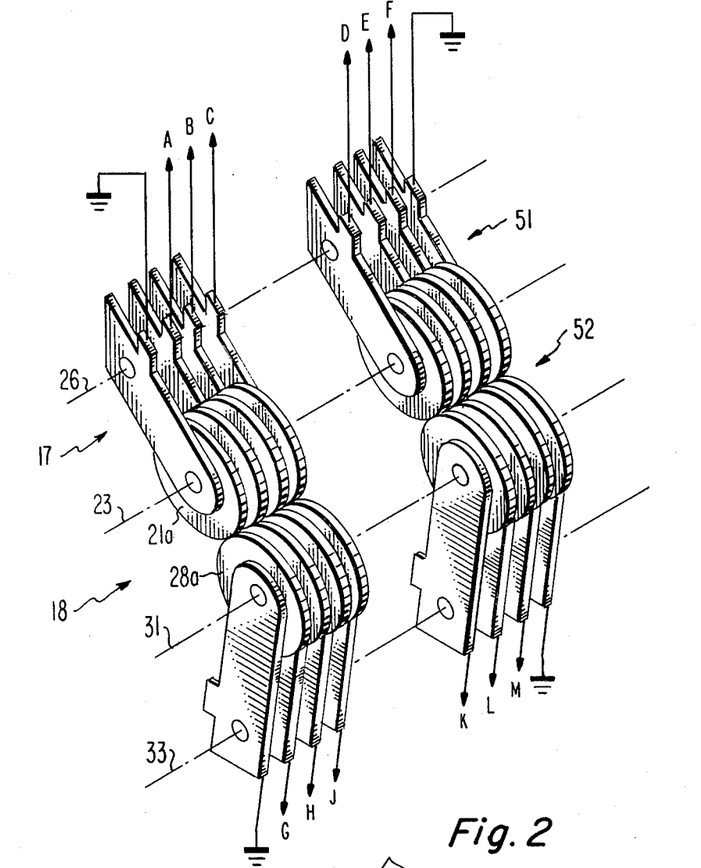
FIG. 2 is a perspective view of a sensor assembly which can be used with the instant invention.

FIG. 2 shows the sensors 17 and 18 and two additional sensors 51 and 52 in more detail. Complete details of the sensors are found in previously referenced U.S. Pat. No. 4,351,263. The sensors 17 and 51 are arranged along the top surface of the strip 10 and the sensors 18 and 52 are arranged along the bottom surface. Each of the sensors includes four electrical contacts, one of which is electrically grounded and the other three of which are voltage biased. The electrically grounded contacts are those which are closest to the edge of the strip. The electrically voltage biased contacts are alphabetically identified. Thus, the voltage biased contacts of sensor 17 are identified A, B, and C, those in sensor 51 are identified D, E, F; those in sensor 18 identified G, H, J, and those in sensor 52 are identified K, L, M. As explained more fully hereinafter with respect to FIGS. 3 and 4, the electrical connection of a specified number of the voltage biased contacts in one sensor to the grounded contact in a different sensor results in the generation of an actuate pulse which actuates the solenoid 42 of the taping mechanism 45 (FIG. 1).

Figure 3A:
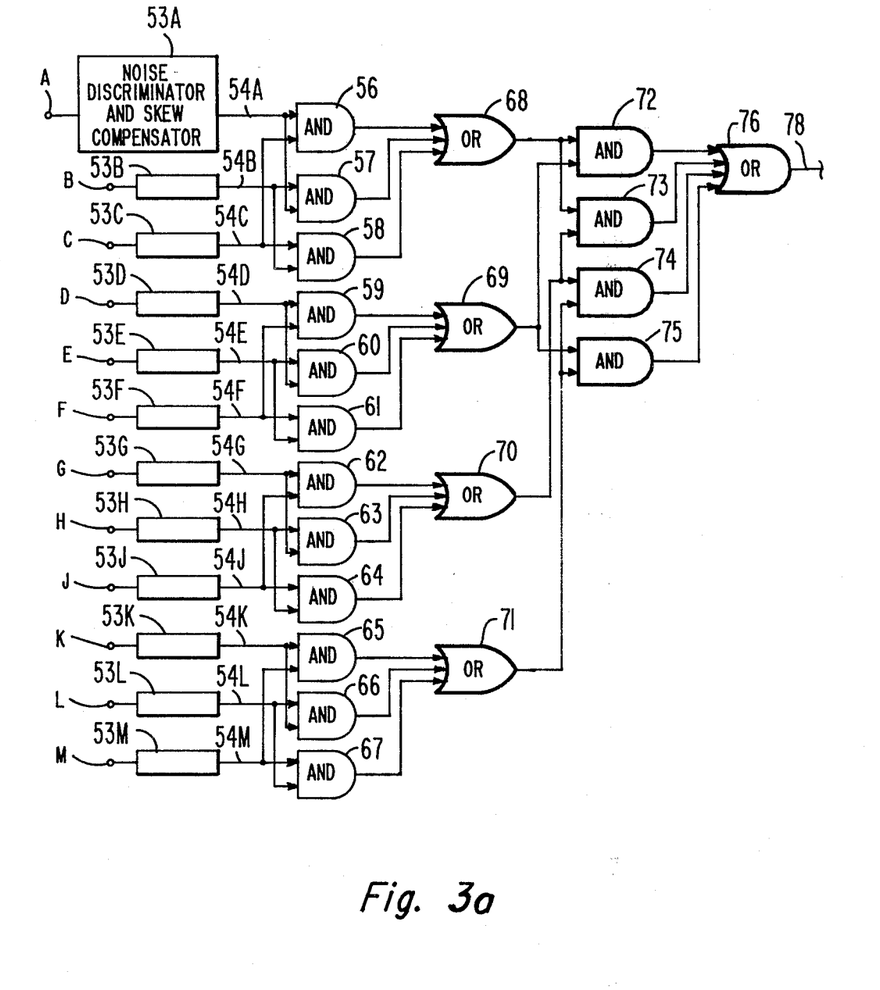
FIGS. 3a and 3b are a preferred embodiment of a control circuit which can be used in the etch line of FIG. 1.
Figures 4, 6A:
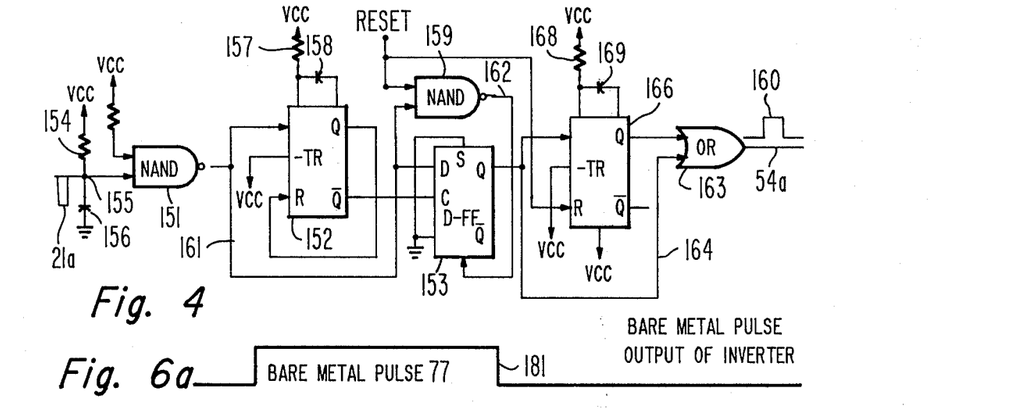
FIG. 4 is a preferred embodiment of a noise discriminator and skew compensating circuit.
FIGS. 6a to 6f are timing diagrams showing how the system responds to a bare metal pulse.

In FIG. 3a, the voltage biased electrical contact A of sensor 17 is connected to a noise discriminator and skew compensation circuit 53A, the details of which are described with respect to FIG. 4. The voltage biased electrical contacts B through M respectively are electrically coupled to noise discriminator and skew compensation circuits 53B through 53M which are identical to the circuit 53A. The output leads 54A through 54M of the discriminator circuits 53A through 53M are connected to the inputs of a series of AND Gates 56 through 67. Each of the AND Gates 56 through 67 receives an input from two of the discriminator circuits. For example, the AND Gate 56 receives inputs from the discriminator circuits 53A and 53C, while the AND Gate 57 receives inputs from the discriminators 53A and 53B and the AND Gate 58 receives inputs from the discriminators 53B and 53C. Accordingly, two of the voltage biased contacts of the sensor 17 must be grounded in order for one of the AND Gates 56, 57 or 58 to provide an output pulse. The AND Gates 56, 57 and 58 thus constitute a first group of gates responsive to the voltage biased contacts A, B, and C of the sensor 17. Similarly, the AND Gates 59, 60 and 61 constitute a second group responsive to the contacts D, E, and F of the sensor 51. The AND Gates 62, 63, and 64 are a third group responsive to the contacts G, H, and J of the sensor 18 while the AND Gates 65, 66 and 67 are a fourth group responsive to the contacts K, L, and M of the sensor 52. A plurality of OR Gates 68, 69, 70 and 71 are individually responsive to each of the groups of AND Gates. Thus, the OR Gate 68 is responsive to the AND Gates 56, 57 and 58. The OR Gates 68 through 71 provide an output pulse whenever any of the AND Gates to which its input lines are connected provides an output pulse. Accordingly, the grounding of any two of the voltage biased contacts within a single sensor results in the generation of an output signal by one of the OR Gates 68 through 71.

Another set of AND Gates 72, 73, 74 and 75 is arranged so that each AND receives the output pulses from two of the OR Gates 68 through 71. Accordingly, the AND Gate 72 receives input pulses from the OR Gates 68 and 69. Similarly, the AND Gate 73 receives input pulses from OR Gates 68 and 70, the AND Gate 74 from OR Gates 70 and 71, and the AND Gate 75 from OR Gates 69 and 71. Accordingly, two of the voltage biased contacts in two of the sensors must be grounded in order for one of the AND Gates 72, 73, 74 or 75 to produce an output pulse. The output leads of the AND Gates 72 through 75 are connected to the input terminals of an OR Gate 76, the output of which constitutes a bare metal pulse 77 which is indicative of the detection of voids in the insulative coating on strip 10 by two of the sensors. The AND Gates 56 to 67 and 72 to 75 therefore respond to the voltage biased contacts A to M in accordance with the Boolean Function:

[(AB+BC+CA)·(DE+EF+FD)]+[(GH+HJ+J-G)·(KL+LM+MK)]+[(AB+BC+CA)·(GH+HJ+JG)]+[(DE+EF+F-D)·(KL+LM+MK)]

Figure 3B:
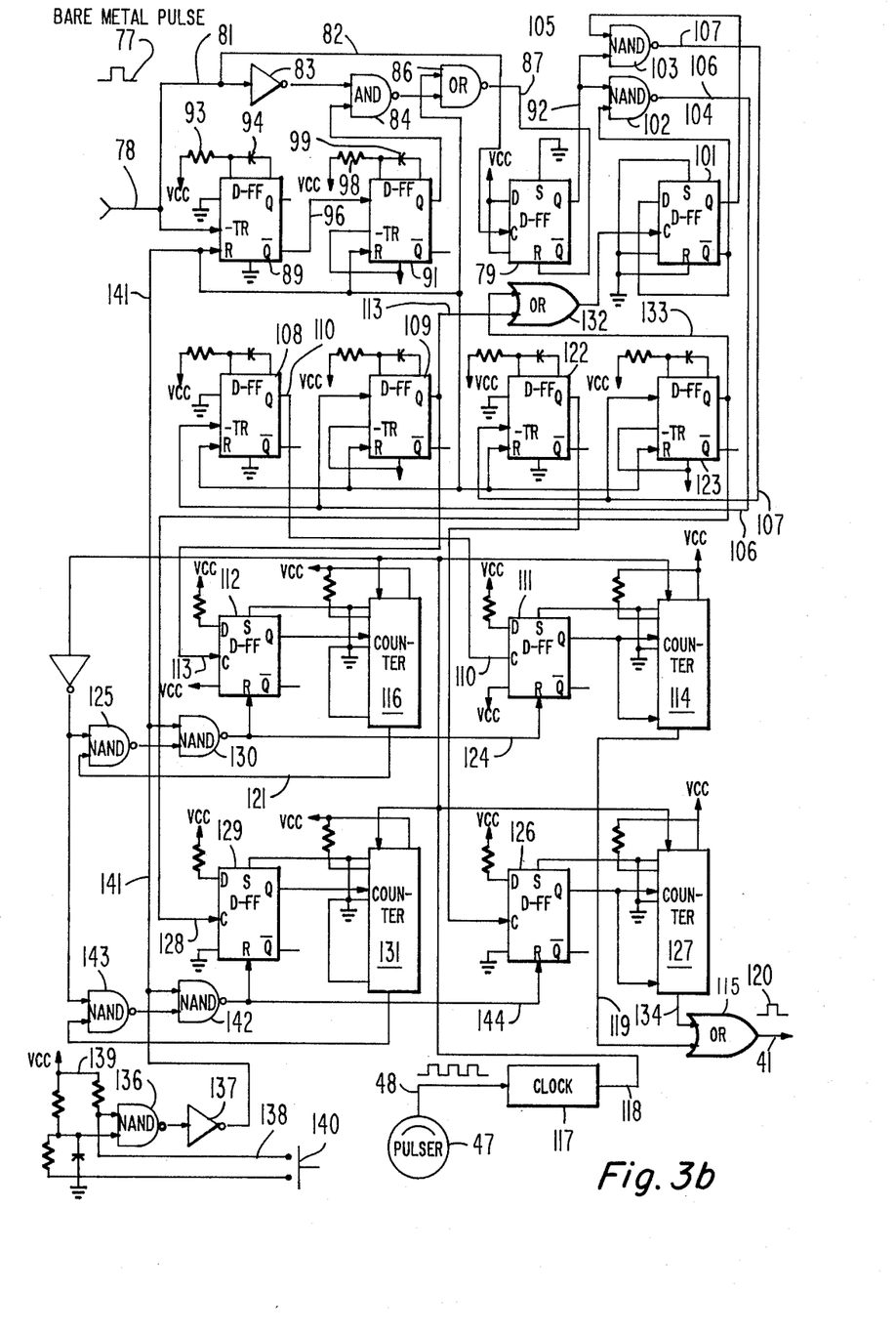

In FIG. 3b, the bare metal pulse 77 on line 78 is fed along several paths. First, the pulse 77 is fed over lines 81 and 82 to the control electrode of a D Type Flip Flop 79. Secondly, the pulse 77 is fed over line 87 to the reset input of the Flip Flop 79 through an inverter 83, an AND Gate 84 and an OR Gate 86. Thirdly, the pulse 77 is fed to a noise discriminator 88 which includes two one-shot multivibrators 89 and 91.

An output line 92 receives the Q output of the Flip Flop 79. When the bare metal pulse 77 is applied to the C input of the Flip Flop 79, the Q output on line 92 goes high and remains so until the end of the pulse 77 when the Flip Flop 79 is reset. FIGS. 5 and 6a through 6f show how the Flip Flop 79 is reset at the termination of the bare metal pulse 77. When the bare metal pulse 77 goes low (181 in FIG. 6a) the output of the inverters 83 goes high (182 in FIG. 6b) and a high is applied to one input of the AND 84. The falling edge of the bare metal pulse 77 triggers the −TR input of the one shot 89 and the $\overline{Q}$ output goes low (183 in FIG. 6c). When the resistor 93 and capacitor 94 cause the Flip Flop 89 to time out (184 in FIG. 6d) the $\overline{Q}$ output returns to high and the positive transition triggers the +TR input of the one shot 91 the Q output of which goes high (185 in FIG. 6d). The Q output of one shot 91 remains high for the time set by the resistor 98 and the capacitor 99 (approximately 0.5 milliseconds, for example) and returns to low (186 in FIG. 6d). The high Q output of the one shot 91 serves as an input to the AND 84 which then receives simultaneous highs from the one shot 91 and the inverter 83 and provides a reset pulse (187 in FIG. 6e) to the Flip Flop 79. The Q output of the Flip Flop 79 is then reset to low (188 in FIG. 6f).

Figure 7A:
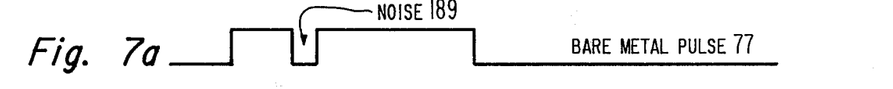
FIGS. 7a to 7f are timing diagrams showing how the system is immune to noise.
Figures 7B, 7C:
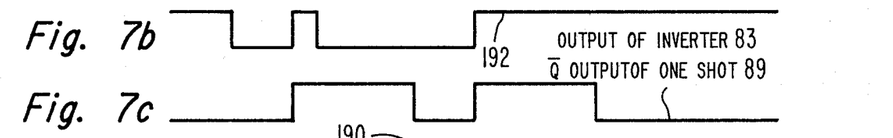
Figure 7D:
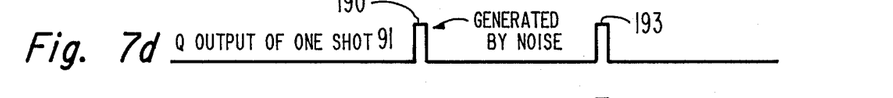
Figure 7E:
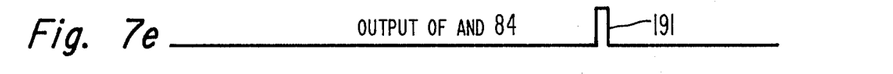
Figure 7F:
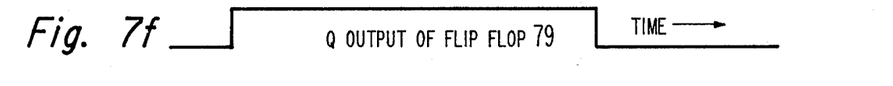

The reset pulse 187 is generated a preset time (approximately 10 milliseconds, for example) after the bare metal pulse 77 goes low and therefore the delay operates as a noise discriminator. If the pulse 77 goes low (189 in FIG. 7a) before the resistor 93 and capacitor 94 time out the noise pulse (190 in FIG. 7d) will not pass through AND Gate 84 because the pulse 77 returned to high before the noise pulse 191 was generated. The AND Gate 84 therefore did not receive simultaneous highs and a reset pulse was not provided to the Flip Flop 79. Accordingly, the reset pulse 191 in FIG. 7e is provided only when the output of the inverter 83 is high (192 in FIG. 7b) simultaneously with a high from the Q output of the one-shot 91 (193 in FIG. 7d).

A D-type Flip Flop 101 and two NAND Gates 102 and 103 cooperate to insure that closely spaced areas of bare metal are detected. The Q output of the D Flip Flop 79 on line 92 is connected to one input of both the NAND Gates 102 and 103. The other inputs of the NAND Gates 102 and 103 are respectively connected by line 104 to the $\overline{Q}$ output of Flip Flop 101 and by line 105 to the Q output. The outputs of the two NAND Gates 102 and 103 which respectively are available on output lines 106 and 107 therefore always are different. The output line 106 from the NAND Gate 102 is connected to the −TR input of a one-shot 108 and to the +TR input of a one-shot 109. The Q output of the one-shot 108 is connected to a D-type Flip Flop 111 by a line 110. Similarly, the Q output of the one-shot 109 is connected to another D-type Flip Flop 112 by the line 113. When the Q output of the one-shot 108 is high, the Flip Flop 111 actuates the counter 114 and clock pulses from a clock 117 available on line 118 clock the counter 114. The desired count for the counter 114 is previously established by thumb wheel switches (not shown) on the counter panel. When the predetermined count set into the counter 114 is reached, a pulse is available on a line 119 to trigger an OR Gate 115 and provide an actuate pulse 120 on the line 41. This pulse energizes the solenoid 42 of the taper 45 (FIG. 1).

When the Q output of the one-shot 109 is high, the Flip Flop 112 is triggered over line 113 to energize the counter 116. The counter 116 also is set to a particular count by thumb wheel switches on the control panel. When the counter 116 reaches the preset count, a reset pulse is provided on the output line 121. The reset pulse causes the outputs of NAND Gates 125 and 130 to go high. The output of the NAND 130 available on the line 124 resets the Flip Flops 111 and 112, resulting in the cessation of the actuate pulse 120. The counters 114 and 116 therefore determine the commencement and duration of the actuate pulse 120. The distance between the taper 45 and bare metal sensors 17, 18, 51 and 52 is known. The pulser 47 puts out a predetermined number of pulses for each unit of length of strip 10 irrespective of the speed of the strip. Accordingly, the counter 114 begins to count as soon as bare metal is detected. The preset count is selected so that the counter 114 reaches the full count and provides the actuate pulse 120 shortly before the bare metal reaches the taper 45. The actuate pulse continues for the duration of the bare metal pulse 77 plus a preselected time thereafter. For example, the actuate pulse begins 2 inches before the bare metal reaches the taper and continues until the bare metal is 2 inches past the taper.

The output line 107 of the NAND Gate 103 is coupled to the −TR of a one-shot 122 and to the +TR input of a one-shot 123. The Q output of the one-shot 122 is applied by a line 124 to a D Flip Flop 126 which is used to control a counter 127. The Q output of the one-shot 123 is applied by line 128 to the input of a D-type Flip Flop 129 to control a counter 131. The flip Flops 126 and 129, and the counters 127 and 131 therefore cooperate with the one-shots 123 and 122 to commence and cause the actuate pulses 120 on the line 41 in the same manner as the counters 114 and 116.

The use of the Flip Flop 101 to control the two sets of counters 114–116 and 127–131 permits the detection of bare metal areas which are closely spaced. The Q outputs of the one-shots 109 and 123 are coupled to the Flip Flop 101 through the OR Gate 132 so that the Flip Flop 101 changes state when either of the one-shots 109 or 123 is actuated. However, because of the action of the counters, after counting is initiated by either of the NAND Gates 102 or 103, the counting continues for the preset counts irrespective of any change to the input of the actuated NAND Gate. For this reason, a second bare metal pulse on line 78 which occurs before the count down of a previous pulse is completed causes the previously unactuated NAND Gate to actuate the other set of counters. The counters 114 and 127 then simultaneously actuate the OR Gate 115 over lines 119 and 134 respectively, and the actuating pulse 120 is provided to the taper 45. Accordingly, the last energized counters continue the actuate pulse after the first energized counter times out.

Manual resetting of the system is made possible by a NAND Gate 136 having two normally high input lines 138 and 139. Manual closing of a switch 140 grounds line 138 to provide a rest pulse. This pulse is passed through an inverter 137 to a reset line 141. The reset pulse on line 141 is applied to the reset inputs of the one-shots 89, 91, 108, 109, 122 and 123. The reset pulse is also applied to the Flip Flops 112, 111 through the NAND Gate 130 over line 124 and through the NAND Gate 142 to the Flip Flops 129 and 126 over the line 144. The Flip Flop 79 also is reset through the OR Gate 86 by the reset pulse.

A preferred embodiment of a noise discriminator and skew compensation circuit which can be used for the identical circuits 53A through 53M of FIG. 3 is shown in FIG. 4. The noise discriminator portion of the circuit includes a NAND Gate 151, a one-shot multivibrator 152 and a D-type Flip Flop 153. One input terminal of the NAND 151 is connected to a positive voltage, such as 12 volt DC. The other input of the NAND 151 is connected to the junction 155 of a resistor 154 and a capacitor 156. The resistor 154 also is connected to the positive voltage. Both inputs of the NAND 151 therefore are normally high and the output of the NAND is low. The junction 155 is also connected to the electrical contact 21a and therefore is grounded when the contact 21a is electrically connected to a grounded contact in one of the four sensors 17, 18, 51 and 52. One input of the NAND 151 then goes low and the output goes high. The output of a one-shot follows the input and therefore even the momentary grounding of the junction 155 would generate a bare metal pulse. The time constant of the rc network formed by a resistor 157 and a capacitor 158 serves as a noise filter. The time constant is selected to be longer, such as 7.5 milliseconds, than the duration of the minimum desired bare metal pulse. Accordingly, the duration of the high output of the NAND 151 must exceed the time constant of the rc network in order for the one-shot to change state and detect the bare metal signal.

The $\overline{Q}$ output of the one-shot 152 is coupled to the control electrode of the Flip Flop 153. The reset input of the Flip Flop 153 is connected to the output of the NAND Gate 159 by a line 162. One input of the NAND 159 is connected to the output of the NAND 151 by the line 161. Accordingly, the change of state of the NAND 151 in response to the bare metal input enables the Flip Flop 153 and the Q output goes high when the duration of the bare metal pulse exceeds the time constant of the rc network formed by resistor 157 and capacitor 158.

Figure 8A:
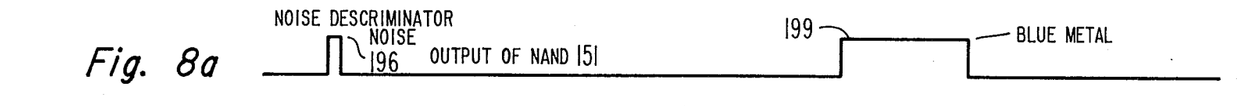
FIGS. 8a to 8e are timing diagrams of the noise discriminator 53A operation.
Figure 8B:
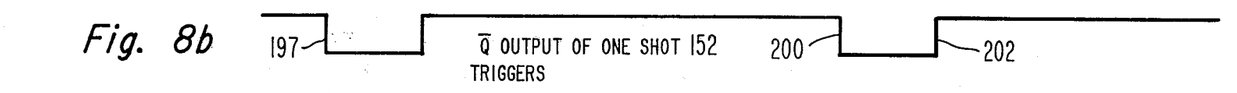
Figure 8C:
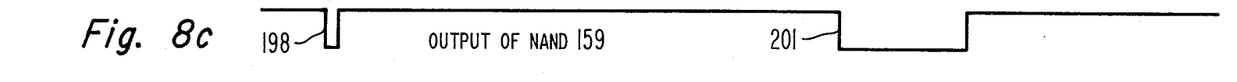

FIGS. 8a to 8e show the operation of the noise discriminator and skew compensation circuit 53A. In FIG. 8a, a noise pulse from contact 21a (FIG. 4) results in a noise pulse 196 output from the NAND 151. In FIG. 8b, the rise of the noise pulse enables the one-shot 152 and the $\overline{Q}$ output goes low at 197. The noise pulse 196 also actuates the NAND 159 which applies the reset pulse 198 of FIG. 8c to the Flip Flop 153. However, the r-c network of the one-shot 152 does not time out during the duration of the noise pulse 196 and therefore the Q output of the Flip Flop 153 remains low and the noise pulse 196 does not result in a bare metal pulse from the OR Gate 163.

Figure 8D:
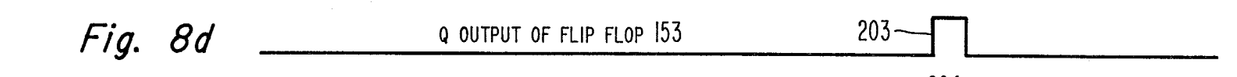
Figure 8E:
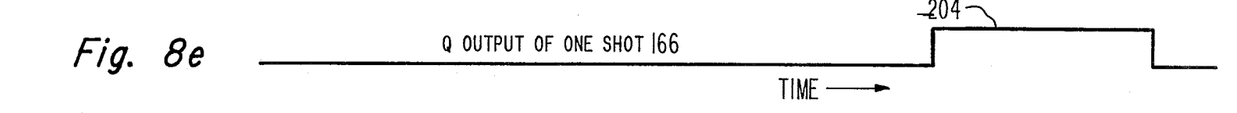

In FIG. 4, when an input to the NAND 151 results from bare metal on the strip 10, a bare metal pulse 199 is available on the line 161. The rise of the pulse 199 triggers the one-shot 152 which goes low at 200 in FIG. 8b. The rise of the pulse 199 also activates the NAND 159 at 201 in FIG. 8c to enable the Flip Flop 153. When the resistor 157 and capacitor 158 network times out, the $\overline{Q}$ output of the one-shot 152 goes high at 202 in FIG. 8b and causes the Q output in Flip Flop 153 to go high at 203 of FIG. 8d. The high Q output of the Flip Flop 153 is applied by the line 164 to the OR Gate 163, the output of which is the bare metal pulse 160 in FIG. 4. The high Q output of the Flip Flop 153 also is applied to the +TR input of the one-shot 166, the Q output of which goes high at 204 in FIG. 8c. The Q output of the Flip Flop 153 also is connected to the +TR input of another one-shot 166 which is used to compensate for skew in the bare metal detected on the strip 10.

Figure 5:
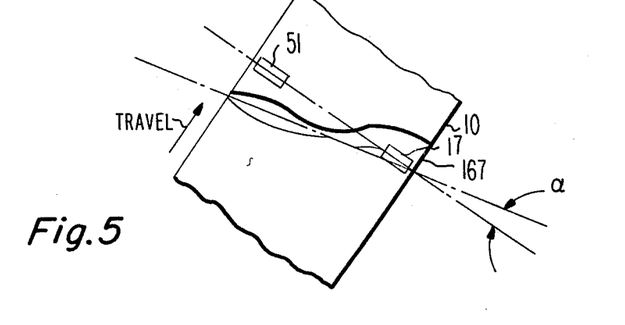
FIG. 5 shows the relationship of skewed bare metal and the sensors on the upper surface of the metal strip.
Figure 6B:
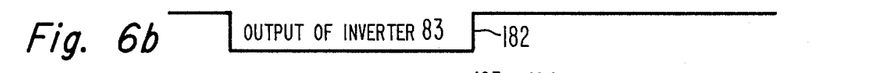
Figure 6C:
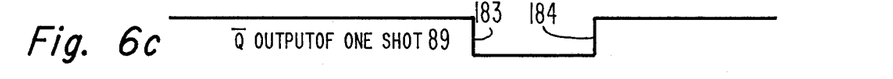
Figure 6D:
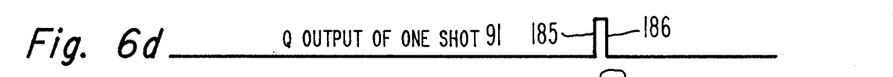
Figure 6E:
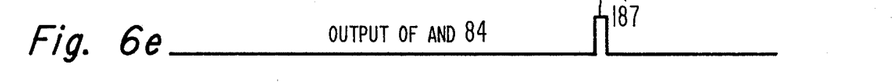
Figure 6F:
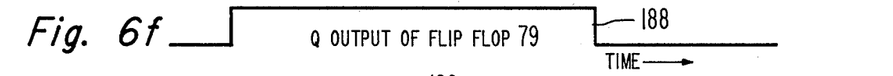

FIG. 5 shows why compensation for skew in the bare metal is necessary. The sensors 17 and 51 are arranged along a line which is perpendicular to the longitudinal axis of the strip 10. The sensor 17 contacts a bare metal area 167 and accordingly, one of the AND Gates 72, 73, 74 or 75 of FIG. 3 would recieve one high input. However, no AND Gate would receive two high inputs and a bare metal pulse 77 would not be provided because the bare metal area 167 has not yet reached the sensor 51. However, when the sensor 51 is reached, the bare metal area 167 will have passed the sensor 17 and a bare metal signal still will not be generated. The one-shot multivibrator 166 (FIG. 4) prolongs the bare metal pulse and avoids this problem.

Figure 9A:
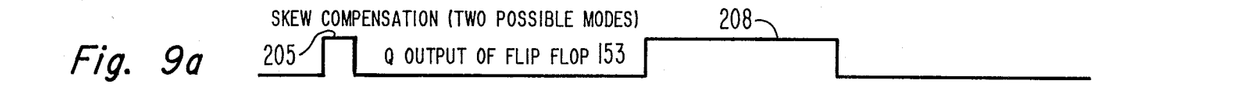
FIGS. 9a to 9c are timing diagrams of the skew compensation.
Figure 9B:
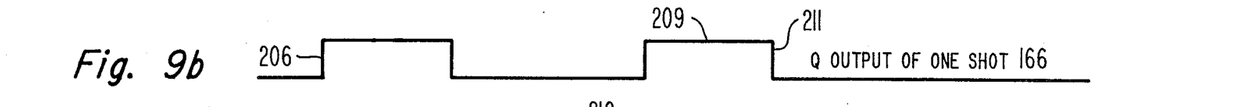
Figure 9C:
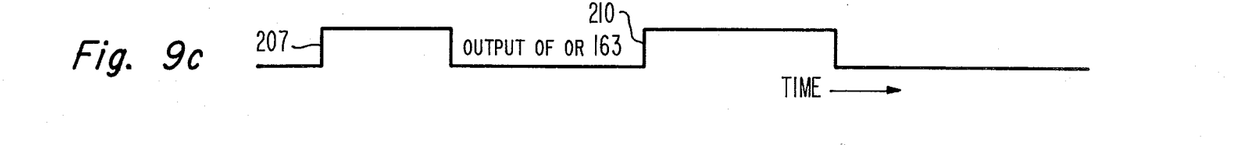

In FIG. 9a, the high Q output 205 of the Flip Flop 153 immediately causes the Q output of one-shot 166 to high at 206 in FIG. 9b. At the same time, the output of the OR Gate 163 goes high at 207 in FIG. 9c and a bare metal pulse 60 is available on line 54A (FIG. 4). The r-c network including the resistor 168 and the capacitor 169 maintains the Q output of the one-shot 166 high after the output pulse 205 returns low and the bare metal pulse 160 remains even although the bare metal area 167 has passed the sensor 17 (FIG. 5). The time delay thus maintains the bare metal pulse for a time sufficient for the bare metal area 167 to reach the sensor 51 depending upon the speed and the strip 10 and the skew angle α. For example, by selecting the resistor 168 and capacitor 169 time constant to be in the order of 0.75 seconds, the bare metal pulse 160 is prolonged for a time equivalent to a skew angle α of about 5° to 6°. At a strip speed of 150 to 200 ipm, respectively, this is equivalent to approximately 2" of travel of the strip 10. Accordingly, the sequential detection of the bare metal portion 167 by the sensors 17 and 51 results in a continuous bare metal pulse on the line 54A so that two of the AND Gates 76 and 75 (FIG. 3) are energized and an acid resistant material is applied to the bottom of the strip 10.

In some instances the bare metal area 167 may be sufficiently wide to maintain a bare metal pulse 160 irrespective of the operation of the one-shot 166. In FIG. 9a, the rise of a bare metal pulse 208 immediately causes the Q output 209 (FIG. 9b) of the one-shot 166 and the output 210 of the OR Gate 163 to go high. However, when the resistor 168 and capacitor 169 network times out at 211 in FIG. 9b, the Q output 208 of the Flip Flop 153 is still high and the output of the OR 163 also remains high. Accordingly, the output of the OR Gate 163 follows the longest high input duration.

In operation, when two of the voltage biased contacts of two of the sensors 17, 18, 51 and 52 are grounded, one of the AND Gates 72, 73, 74 or 75 causes the OR Gate 76 to provide a bare metal pulse 77 on the line 78 (FIG. 3) resulting in the change of state of one of the NAND Gates 102 or 103. One of the counter sets 114–116 or 127–131 is set and receives clock pulses from the clock 117 in accordance with the rotational speed of the pulser 47. When the actuated counter 114 or 127 reaches the preset count, the bare metal area is close to the taper 45 and the OR Gate 115 provides the actuate pulse 120 on output line 141. The actuate pulse is applied to the solenoid 42 (FIG. 1) and one or more strips of the tape 44 is applied to strip 10. The other counter 112 or 129 determines the duration of the pulse 120 beyond the duration of the bare metal pulse and thus also establishes the application of the tape strips past the bare metal area. The rate of counting is determined by the clock 117, and the clock rate is determined by the pulser 47. Accordingly, the pulse input rate to the clock is a function of the velocity of the strip 10, and the preset counts to the counters 114, 116, 127 and 131 remain constant for all velocities of the strip 10. After the strengthening material is applied to the bottom of the strip 10, the strip can pass through the etching tank 11 without being broken because of the etching action on the bare metal area.

What is claimed is:

1. In combination with an apparatus for sensing bare metal on a moving strip of insulated conductive material, said apparatus including a plurality of sensors arranged on both sides of said strip, each of said sensors including a plurality of voltage biased electrical contacts and a grounded electrical contact; a control system for providing a bare metal output signal in response to the selective grounding of said voltage biased electrical contacts comprising:

a plurality of first means individually responsive to said sensors for providing a first signal when at least one of said voltage biased contacts of one sensor is electrically connected to said grounded contact of another of said sensors;

a plurality of second means, each of said second means being responsive to at least two of said first means for providing a second signal in response to the simultaneous reception of two of said first signals; and third means responsive to said second means for providing said bare metal signal in reponse to the reception of said second signals.

2. The control system of claim 1 wherein said first means is a first plurality of AND Gates.

3. The control system of claim 2 wherein each of said sensors includes three of said voltage biased electrical contacts, each of said voltage biased electrical contacts being coupled to an input terminal of two and said first plurality of AND Gates.

4. The control system of claim 3 wherein said plurality of second means includes a second plurality of AND Gates, each AND Gate of said second plurality being responsive to two AND Gates of said first plurality of AND Gates whereby the grounding of two voltage biased contacts of two of said sensors results in an output pulse from one AND Gate said second plurality of AND Gates, and said third means being responsive to all AND Gates of said second set.

5. The control system of claim 4 wherein said bare metal signal is a pulse and further including means responsive to said pulse for providing an actuate pulse when bare metal connects selected pairs of said sensors.

6. The control system of claim 5 wherein said means responsive to said bare metal includes first counter means for beginning and ending said actuate pulse at preset counts.

7. The control system of claim 6 wherein said counter means includes a first counter for beginning said actuate pulse when said bare metal has moved a first predetermined distance and second counter means for ending said actuate pulse after said strip has moved a second predetermined distance.

8. The control system of claim 7 further including means for providing actuate pulse in response to bare metal signals from closely spaced bare metal areas of said strip.

9. The control system of claim 8 wherein said means for providing said actuate pulse in response to closely spaced bare metal areas includes second counter means and means for alternately actuating said first and second counter means.

10. The control system of claim 6 or 9 further including means for providing clocking pulses as a function of the speed of said strip for clocking said counters.

11. The control system of claim 10 further including means for prolonging said bare metal pulse so that bare metal which is skewed with respect to the alignment of said sensors across said strip is detected.

12. The control system of claim 11 wherein said means for prolonging includes time delay means.

13. In combination with an apparatus for sensing bare metal on a moving strip of insulated conductive material, said apparatus including a first sensor having voltage biased electrical contacts respectively identified A, B, and C and one grounded contact, a second sensor having voltage biased electrical contacts respectively identified D, E, and F and one grounded contact, a third sensor having voltage biased electrical contacts respectively identified G, H, and J and one grounded contact, and a fourth sensor having voltage biased electrical contacts respectively identified K, L, and M and one grounded contact, a control system comprising:

logic means for providing a bare metal pulse when electrically biased contacts of one sensor are electrically connected to the grounded contact of another sensor in accordance with the Boolean Function:

[(AB+BC+CA)·(DE+EF+FD)]+[(GH+HJ+JG)·(KL+LM+MK)]+[(AB+BC+CA)·(GH+HJ+JG)]+[(DE+EF+FD)·(KL+LM+MK)].

14. The system of claim 13 wherein said first and second sensors are arranged along the edges of one surface of said strip and said third and fourth sensors are arranged along the edges of the other surface of said strip.

15. The system of claim 14 wherein said logic means includes a group of AND Gates, associated with each of said sensors, the AND Gates of each group being responsive to the grounding of two of said voltage biased electrical contacts of the respective sensor.

16. The system of claim 15 wherein said logic means further includes a plurality of additional gates, each of said additional gates being responsive to the AND Gates of one of said groups, and a plurality of bare metal AND Gates, each of said bare metal AND Gates being responsive to two of said additional gates.

17. The system of claim 16 wherein one of said bare metal AND Gates is responsive to said first and second sensor, one of said bare metal AND Gates is responsive to said first and third sensors, one of said bare metal AND Gates is responsive to said third and fourth sensors, and one of said bare metal AND Gates is responsive to said second and fourth sensors.

18. The system of claim 17 further including means for providing said actuate pulse in response to bare metal signals from closely spaced bare metal areas of said strip.

19. The system of claim 18 wherein said means responsive to said bare metal pulse includes first counter means for beginning and ending said actuate pulse at preset counts.

20. The system of claim 19 further including means for clocking said counter means as a function of the speed of said strip.

21. The system of claim 14 further including means for prolonging said bare metal pulse so that bare metal which is skewed with respect to the alignment of said sensors across said strip is detected.

22. The system of claim 21 wherein said means for prolonging includes time delay means.

23. A method of sensing bare metal exposed by voids in the insulative coating on a moving strip of conductive material comprising the steps of:

arranging multicontact electrical sensors along both edges and on both surfaces of strip;

grounding one contact in each of said sensors;

voltage biasing the other contacts in each of said sensors;

providing an actuate pulse when at least one voltage biased contact in one sensor is connected to the grounded contact in another sensor in accordance with the Boolean Function:

[(AB+BC+CA)·(DE+EF+FD)]+[(GH+HJ+JG)~(KL+LM+M-

K)]+[(AB+BC+CA)·(GH+HJ+JG)]+[(DE+EF+FD)·(KL+LM+MK)]

where:

A, B, and C identify the biased contacts in one sensor

D, E, and F identify the biased contacts in another sensor

G, H, and J identify the biased contacts in another sensor

K, L, and M identify the biased contacts in another sensor using said actuate pulse to indicate the presence of said bare metal.

24. The method of claim 23 further including the step of using said actuate pulse to place a strengthening material onto said strip.

* * * * *